(12) United States Patent
Yoon et al.

(10) Patent No.: US 11,307,265 B2
(45) Date of Patent: Apr. 19, 2022

(54) EARTH LEAKAGE CIRCUIT BREAKER

(71) Applicant: LS ELECTRIC CO., LTD., Anyang-si (KR)

(72) Inventors: Jaeshik Yoon, Anyang-si (KR); Jaeyoung Yu, Anyang-si (KR); Hyunyoung Jung, Anyang-si (KR)

(73) Assignee: LS ELECTRIC CO., LTD., Anyang-Si (KR)

( * ) Notice: Subject to any disclaimer, the term of this patent is extended or adjusted under 35 U.S.C. 154(b) by 0 days.

(21) Appl. No.: 16/975,528

(22) PCT Filed: Nov. 21, 2018

(86) PCT No.: PCT/KR2018/014327
§ 371 (c)(1),
(2) Date: Aug. 25, 2020

(87) PCT Pub. No.: WO2019/190018
PCT Pub. Date: Oct. 3, 2019

(65) Prior Publication Data
US 2021/0035764 A1 Feb. 4, 2021

(30) Foreign Application Priority Data
Mar. 28, 2018 (KR) .................. 10-2018-0036112

(51) Int. Cl.
*G01R 19/165* (2006.01)
*G01R 19/25* (2006.01)
(Continued)

(52) U.S. Cl.
CPC ....... *G01R 31/52* (2020.01); *G01R 19/16528* (2013.01); *G01R 19/2509* (2013.01); *H01H 83/02* (2013.01)

(58) Field of Classification Search
CPC ............ G01R 19/165; G01R 19/16528; G01R 19/25; G01R 19/2509; G01R 31/52
See application file for complete search history.

(56) References Cited

U.S. PATENT DOCUMENTS

| 4,247,879 A | 1/1981 | Elms et al. | |
|---|---|---|---|
| 2009/0316312 A1* | 12/2009 | Kim | H02H 3/337 361/42 |

(Continued)

FOREIGN PATENT DOCUMENTS

| JP | S54-140143 A | 10/1979 |
|---|---|---|
| JP | 07312823 A | 11/1995 |

(Continued)

OTHER PUBLICATIONS

English translation of Okatsuchi JPH07312823 (Year: 1995).*

(Continued)

*Primary Examiner* — Thienvu V Tran
*Assistant Examiner* — Bart Iliya
(74) *Attorney, Agent, or Firm* — K&L Gates LLP

(57) ABSTRACT

The earth leakage circuit breaker of the present disclosure includes a leakage current detection unit outputting a leakage current detection signal; a conversion unit outputting the leakage current magnitude of a fundamental wave component, a ratio of a third harmonic component, and a ratio of a positive pole peak current value to a negative pole peak current value; and a control unit comparing the leakage current magnitude of a fundamental wave component, the ratio of a third harmonic component, and the ratio of a positive pole peak current value to a negative pole peak current value with predetermined reference values to determine whether a leakage current of the alternating current component is generated or a leakage current of the direct current component is generated and to thereby output a trip control signal when it is determined that the leakage current of the direct current or alternating current component is generated.

7 Claims, 3 Drawing Sheets

(51) Int. Cl.
*H01H 83/02* (2006.01)
*G01R 31/52* (2020.01)

(56) References Cited

U.S. PATENT DOCUMENTS

2015/0192631 A1* 7/2015 Seon .................. H02H 3/33
324/509
2017/0285087 A1* 10/2017 Onishi .................. H02H 3/162

FOREIGN PATENT DOCUMENTS

| JP | 2011200024 A | 10/2011 |
|---|---|---|
| JP | 2016144297 A | 8/2016 |
| JP | 2017188986 A | 10/2017 |
| JP | 2017200255 A | 11/2017 |
| KR | 1019940017031 A | 7/1994 |
| KR | 20030028670 A | 4/2003 |
| KR | 101616797 B1 | 4/2016 |
| WO | 2012127307 A1 | 9/2012 |

OTHER PUBLICATIONS

English translation of Lee KR20030028670 (Year: 2003).*
English translation of Asai JP2016144297 (Year: 2016).*
International Search Report for related International Application No. PCT/KR2018/014327; report dated Oct. 3, 2019; (5 pages).
Written Opinion for related International Application No. PCT/KR2018/014327; report dated Oct. 3, 2019; (5 pages).
Japanese Notice of Allowance for related Japanese Application No. 2020-543757; action dated Sep. 17, 2021; (3 pages).
Extended European Search Report for related European Application No. 18912092.6; action dated Dec. 3, 2021; (8 pages).

* cited by examiner

EARTH LEAKAGE CIRCUIT BREAKER

CROSS-REFERENCE TO RELATED APPLICATIONS

The present application is a National Stage of International Application No. PCT/KR2018/014327, filed on Nov. 21, 2018, which claims the benefit of earlier filing date and right of priority to Korean Application No. 10-2018-0036112 filed on Mar. 28, 2018, the contents of which are all hereby incorporated by reference herein in their entirety.

TECHNICAL FIELD

The present disclosure relates to an earth leakage circuit breaker.

BACKGROUND

In the related art, it was possible to detect a leakage current of an alternating current component on a circuit and to cut off the circuit in response thereto, but failed to provide an earth leakage circuit breaker capable of reliable detection of a leakage current of a direct current component (or a direct current pulsation component) on a circuit and circuit breakage in response thereto.

SUMMARY

An aspect of the present disclosure is to provide an earth leakage circuit breaker capable of reliable detection of a leakage current of an alternating current component on a circuit as well as a leakage current of a direct current pulsation component and circuit breakage in response thereto.

The aspect of the present disclosure may be achieved by providing an earth leakage circuit breaker according to an embodiment of the present disclosure including: a leakage current detection unit for outputting a leakage current detection signal according to the leakage current from a circuit; a conversion unit for outputting the leakage current magnitude of a fundamental wave component, a ratio of a third harmonic component, and a ratio of a positive pole peak current value to a negative pole peak current value, on the basis of the leakage current detection signal outputted from the current detection unit; and a control unit for comparing the leakage current magnitude of a fundamental wave component, the ratio of a third harmonic component, and the ratio of a positive pole peak current value to a negative pole peak current value, outputted by the conversion unit, with predetermined reference values to determine whether or not a leakage current of the alternating current component is generated or a leakage current of the direct current component is generated and to thereby output a trip control signal when it is determined that the leakage current of the direct current or alternating current component is generated.

According to a preferred aspect of the present disclosure, the conversion unit includes: an analog to digital converter configured to convert the leakage current detection signal, which is an analog signal, into a digital signal in a time domain by sampling the leakage current detection signal; a discrete Fourier transformer configured to output the converted digital signal as a digital signal in a frequency domain by discrete Fourier transform; an alternating current component converter configured to determine the leakage current magnitude of the fundamental wave component and the magnitude of the third harmonic component based on the discrete Fourier transformed digital signal, and to calculate a ratio of the third harmonic component that is a ratio of the magnitude of the third harmonic component to the leakage current magnitude of the fundamental wave component; and a direct current component converter configured to calculate a ratio of the positive pole peak current value to the negative pole peak current value based on the discrete Fourier transformed digital signal.

According to another preferred aspect of the present disclosure, the reference values include: a first reference current value set according to a sensitivity to a leakage current; and a second reference current value set to distinguish a leakage current that needs circuit breakage and exceeding the first reference current value.

According to still another preferred aspect of the present disclosure, the control unit is configured to count a number of generations when the leakage current magnitude of the fundamental wave component is not less than the second reference current value, and when the counted number of generations reaches a predetermined threshold value, to output a trip control signal by determining that a leakage current of an alternating current component is generated.

According to still another preferred aspect of the present disclosure, the control unit is configured to compare the third harmonic component ratio with a predetermined reference third harmonic component ratio to count a number of generations when the third harmonic component ratio is less than the reference third harmonic component ratio, and when the counted number of generations reaches a predetermined threshold value, to output a trip control signal by determining that a leakage current of an alternating current component is generated.

According to still another preferred aspect of the present disclosure, the control unit is configured to count a number of generations when the ratio of the positive pole peak current value to the negative pole peak current value is not less than a predetermined reference ratio, and when the counted number of generations reaches a predetermined threshold value, to output a trip control signal by determining that a leakage current of a direct current component is generated.

According to still another preferred aspect of the present disclosure, the control unit is configured to initialize the counted number of generations when the ratio of the positive pole peak current value to the negative pole peak current value is less than the predetermined reference ratio.

As the earth leakage circuit breaker according to the present disclosure includes: a leakage current detection unit for outputting a leakage current detection signal according to the leakage current from a circuit; a conversion unit for outputting the leakage current magnitude of a fundamental wave component, a ratio of a third harmonic component, and a ratio of a positive pole peak current value to a negative pole peak current value, on the basis of the leakage current detection signal outputted from the current detection unit; and a control unit for comparing the leakage current magnitude of a fundamental wave component, the ratio of a third harmonic component, and the ratio of a positive pole peak current value to a negative pole peak current value, outputted by the conversion unit, with predetermined reference values to determine whether or not a leakage current of an alternating current component is generated or a leakage current of a direct current component is generated and to thereby output a trip control signal when it is determined that the leakage current of the direct current or alternating current component is generated, the earth leakage circuit breaker may reliably detect a generation of a leakage current of the alternating current component on a circuit separately from a balanced current (three phase balanced current or normal current) to cut off the circuit, and also reliably detect a generation of a leakage current of the direct current component on a circuit separately from the balanced current to cut off the circuit.

In the circuit breaker according to the present disclosure, as the conversion unit includes: an analog to digital converter to convert the leakage current detection signal, which is an analog signal, into a digital signal in a time domain by sampling the leakage current detection signal; a discrete Fourier transformer to output the converted digital signal as a digital signal in a frequency domain by discrete Fourier transform; an alternating current component converter configured to determine the leakage current magnitude of the fundamental wave component and the magnitude of the third harmonic component based on the discrete Fourier transformed digital signal, and to calculate a ratio of the third harmonic component that is a ratio of the magnitude of the third harmonic component to the leakage current magnitude of the fundamental wave component; and a direct current component converter configured to calculate a ratio of the positive pole peak current value to the negative pole peak current value based on the discrete Fourier transformed digital signal, the conversion unit may calculate the magnitude of the fundamental wave component and the ratio of the third harmonic component to provide them to the control unit so that a leakage current of the alternating current component or ground fault current on a circuit is distinguishable from a balanced current (three-phase balanced current or normal current) in which the circuit should not be cut off, and may calculate a ratio of the positive pole peak current value to the negative pole peak current value to provided it to the control unit so that a leakage current of the direct current component on a circuit and the balanced current are distinguishable.

In the earth leakage circuit breaker according to the present disclosure, since the corresponding reference values include a first reference current value set according to a sensitivity to a leakage current and a second reference current value set to distinguish a leakage current that needs circuit breakage and exceeding the first reference current value, a stepwise action of warning and breakage may be performed on each current level by dividing the reference current values for determination of a leakage current into a primary reference value (a first reference current value), which is a preliminary boundary level, and a second reference current value, which is a basis for determining a circuit breakage.

In the earth leakage circuit breaker according to the present disclosure, since the control unit is configured to count a number of generations when a magnitude of the leakage current of the fundamental wave component is not less than the second reference current value, and to output a trip control signal when the counted number of generations reaches a predetermined threshold value determining that a leakage current of the alternating current component is generated, even when a magnitude of a leakage of a normal current in a power system (a magnitude of a leakage current of the fundamental wave component) exceeds a level of circuit breakage, the control unit may prevent an occurrence of malfunction due to a temporary current leakage by cutting off a circuit only in an instance where the excessed state continues.

In the earth leakage circuit breaker according to the present disclosure, the control unit is configured to compare the third harmonic component ratio with a predetermined reference third harmonic component ratio to count number of generations when the third harmonic component ratio is less than the reference third harmonic component ratio, and when the counted number of generations reaches a predetermined threshold value, to output a trip control signal by determining that a leakage current of an alternating current component is generated. Therefore, the control unit may accurately distinguish between a balanced current (three-phase balanced current or normal current) in which the circuit should not be cut off and a leakage current of the alternating current component or ground fault current on a circuit in which the circuit should be cut off, and even a leakage current is generated, may cut off the circuit only when the leakage current is continuous so as to prevent an occurrence of malfunction due to a temporary leakage current.

In the circuit breaker according to the present disclosure, the control unit is configured to count a number of generations when the ratio of the positive pole peak current value to the negative pole peak current value is not less than a predetermined reference ratio, and when the counted number of generations reaches a predetermined threshold value, to output a trip control signal by determining that a leakage current of a direct current component is generated. Accordingly, the control unit may accurately distinguish between a balanced current (three-phase balanced current or normal current) in which the circuit should not be cut off and a leakage current of the direct current component on a circuit in which the circuit should be cut off, and even a leakage current of direct current is generated, may cut off the circuit only when the leakage current is continuous so as to prevent an occurrence of malfunction due to a temporary direct current leakage.

In the earth leakage circuit breaker according to the present disclosure, since the control unit is configured to initialize the counted number of generations when the ratio of the positive pole peak current value to the negative pole peak current value is less than the predetermined reference ratio, when the circuit is normalized from the state in which the leakage current of direct current is generated temporarily, the control unit immediately initialize the number of generations so as to prevent an erroneous operation in which the circuit breaker cuts off the circuit in a normal state.

DETAILED DESCRIPTION

The above-described aspects of the present disclosure and configurations and operational effects of the present disclosure to achieve the above aspects will be more clearly understood by the following description of the preferred embodiment of the present disclosure with reference to the accompanying drawings.

Figure 1:
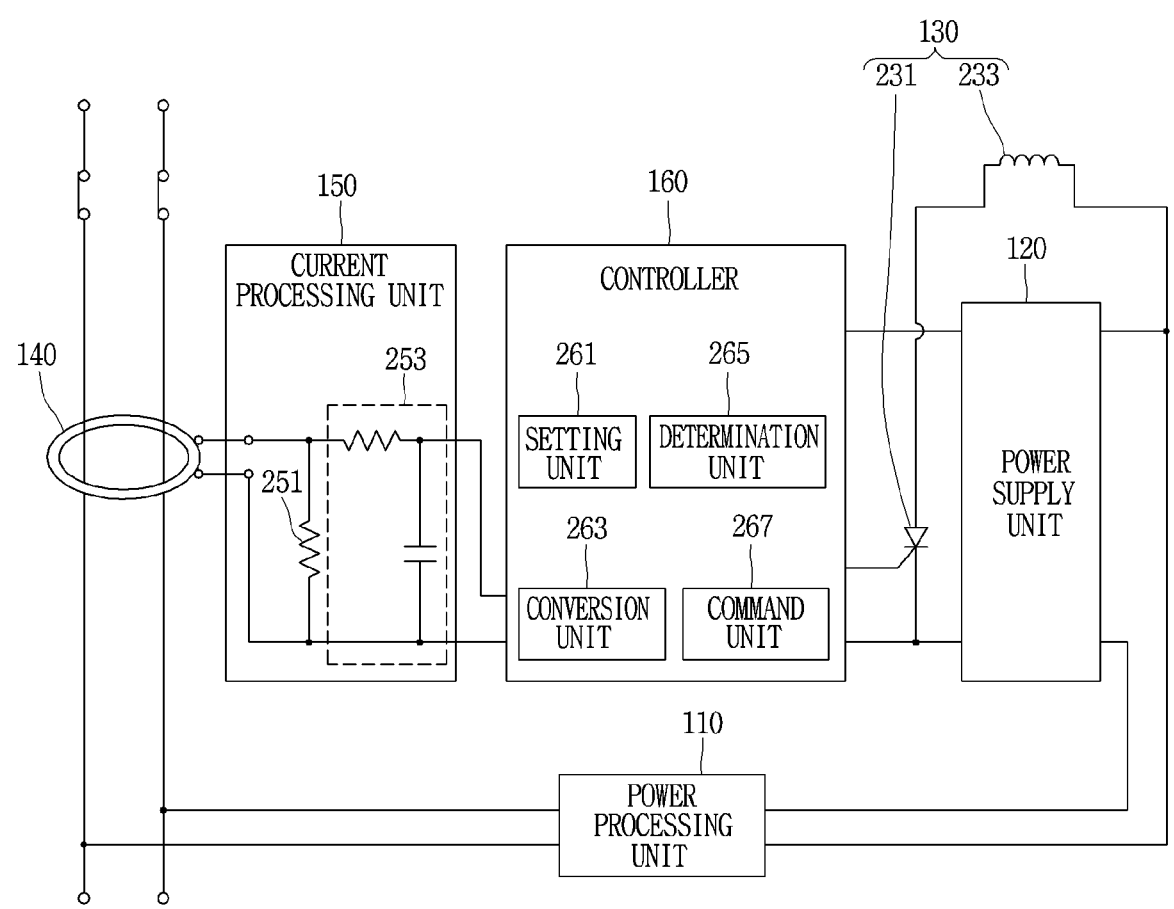
FIG. 1 is a block diagram illustrating an electrical configuration of an earth leakage circuit breaker according to a preferred embodiment of the present disclosure.
Figure 3:
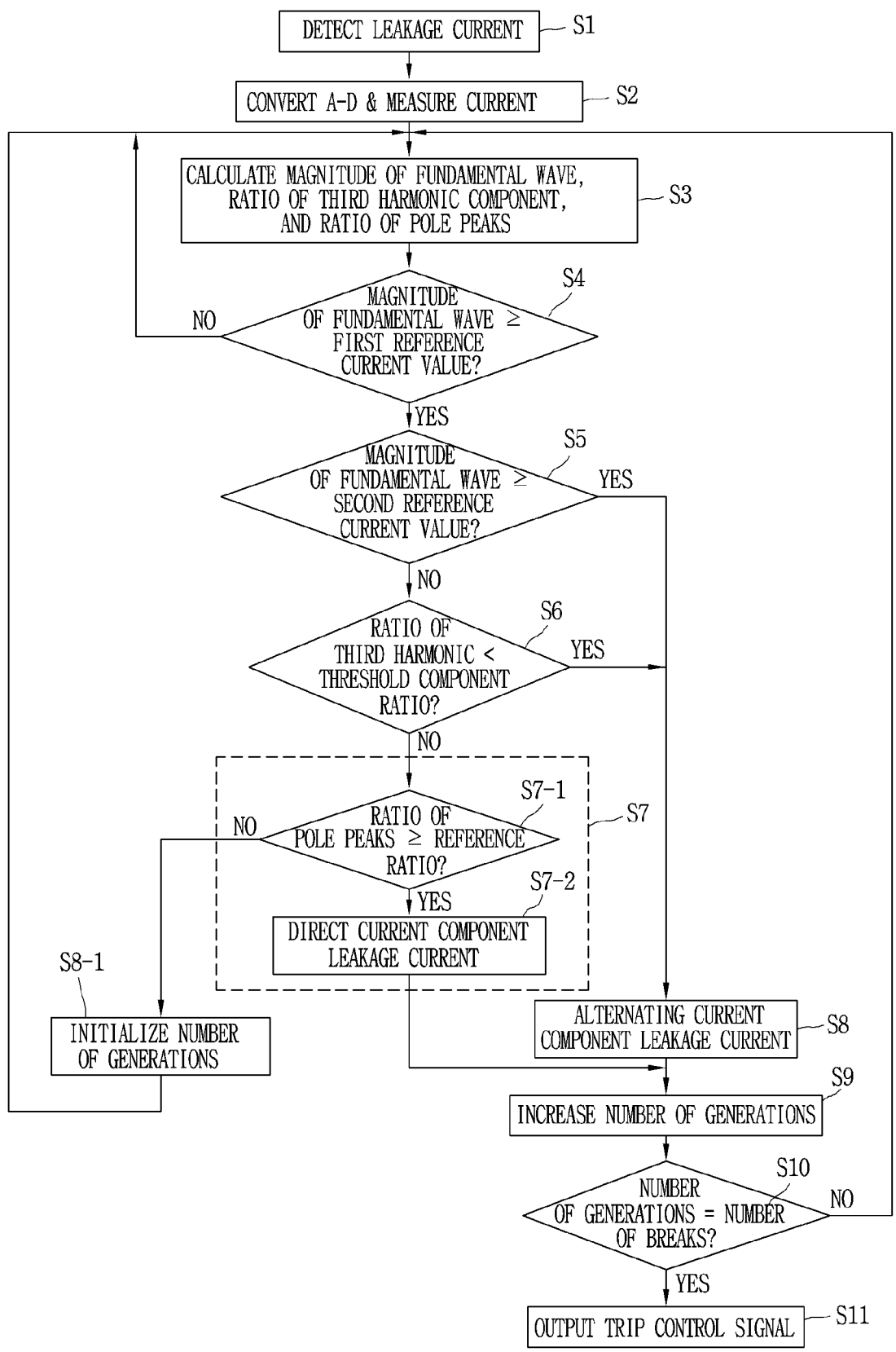
FIG. 3 is a flowchart illustrating a method for controlling an earth leakage circuit breaker according to a preferred embodiment of the present disclosure.

FIG. 1 is a block diagram illustrating an electrical configuration of an earth leakage circuit breaker according to a preferred embodiment of the present disclosure, and FIG. 3 is a flowchart illustrating a method for controlling an earth leakage circuit breaker according to a preferred embodiment of the present disclosure.

Referring to FIG. 1, an earth leakage circuit breaker according to the present disclosure may include a leakage current detection unit 140, a conversion unit 263, and a control unit (or a controller) 160.

The earth leakage circuit breaker according to the present disclosure may further include a power processing unit 110, a power supply unit 120, a trip coil unit 130, and a current processing unit 150.

The power processing unit 110 may process alternating current power supplied on a circuit. Here, the power processing unit 110 includes a rectifier circuit to convert the alternating current of the alternating current power into direct current. In addition, the power processing unit 110 may transmit direct current power to the power supply unit 120.

The power supply unit 120 may supply direct current power needed in an operation of the electrical component of the earth leakage circuit breaker according to the present disclosure. To this end, the power supply unit 120 may include a DC-DC converter circuit, and convert the direct current power provided from the power processing unit 110 into direct current power needed in the operation of the electrical component of the earth leakage circuit breaker, for example, direct current 5 volts (V), to supply the converted direct current to the trip coil unit 130 and the control unit 160.

The trip coil unit 130 may include a semiconductor switch 231 (e.g., a thyristor or an SCR, etc.) and a trip coil 233, as illustrated in FIG. 1.

The semiconductor switch 231 may be turned on or turned off in response to a control (trip control signal) of the control unit 160. That is, when the trip control signal from the control unit 160 is supplied to a gate, the semiconductor switch 231 is turned on, and when the trip control signal from the control unit 160 is not supplied to the gate, the semiconductor switch 231 may be turned off.

When the semiconductor switch 231 is turned on, the direct current power from the power supply unit 120 is supplied to the trip coil 233 as the power supply unit 120, the semiconductor switch 231, and the trip coil 233 form a closed circuit, and the trip coil 233 is magnetized.

When the semiconductor switch 231 is turned off, the direct current power from the power supply unit 120 is not supplied to the trip coil 233 as the circuits of the power supply unit 120, the semiconductor switch 231, and the trip coil 233 are opened, and the trip coil 233 is demagnetized.

When the trip coil 233 is magnetized, a switching mechanism of the earth leakage circuit breaker trips as an armature (not illustrated) of the earth leakage circuit breaker triggers the switching mechanism to be tripped as well known. And, the circuit may be cut off as a movable contact is separated from a corresponding fixed contact.

The leakage current detection unit 140 outputs a leakage current detection signal according to the current leaked from the circuit. To this end, the leakage current detection unit 140 may include a ring-type core through which circuits penetrate as illustrated in FIG. 1, and a well-known zero current transformer (ZCT) 240 having a secondary winding wound on the corresponding core to output the leakage current detection signal.

The current processing unit 150 is installed between the leakage current detection unit 140 and the control unit 160 to process the leakage current detection signal detected by the leakage current detection unit 140 in an analog signal state. Here, the process includes converting the leakage current detection signal into an analog voltage signal and removing high frequency noise from the leakage current detection signal. To this end, the current processing unit 150 may include a shunt resistor 251 to convert the leakage current detection signal into an analog voltage signal, and a low pass filter unit 253 to remove the high frequency noise that might be mixed with the leakage current detection signal.

The control unit 160 may include an analog to digital converter, a discrete Fourier transformer, a central processing unit in charge of calculation and processing of an input signal, a memory to store pre-stored calculation and processing programs, and a micro controller unit, a microprocessor, or a microcomputer including a memory or others that stores a preset reference value or calculated value.

The control unit compares the leakage current magnitude of a fundamental wave component, a ratio of a third harmonic component, and a ratio of a positive pole peak current value to a negative pole peak current value, outputted by the conversion unit 263, with predetermined reference values to determine whether or not a leakage current of an alternating current component is generated or a leakage current of a direct current component is generated and thereby outputs a trip control signal when it is determined that the leakage current of the direct current or alternating current component is generated.

The control unit 160 may determine whether the current is an abnormal current based on the leakage current detection signal detected by the leakage current detection unit 140. Here, the abnormal current refers to an unbalanced current (a current in which a sum of three phase currents is not zero) that is induced as a leakage detection signal in the secondary winding of the zero current transformer of the leakage current detection unit 140 accordingly when a leakage or ground fault is generated in the circuit, and may be distinguished from a balanced current (a current in which the sum of three phase currents is zero). Here, the control unit 160 may determine whether an abnormal current is generated on the circuit based on the leakage detection signal detected by the leakage current detection unit 140 at a predetermined time interval. For example, the time interval may be 10 milliseconds (ms). Here, the control unit 160 may determine whether a leakage current is generated on the circuit based on the magnitude of the fundamental wave component (e.g., 60 Hz alternating current waveform component of a normal power system) of the current (or of the leakage current detection signal).

To this end, the control unit 160 may include a setting unit 261, the conversion unit 263, a determination unit 265, and a command unit 267, as illustrated in FIG. 1.

The setting unit 261 is a means to store setting data inputted through a setting means (not illustrated). Here, the setting means may include at least one of a plurality of setting switches or setting knobs (not illustrated), a key pad provided separately from the earth leakage circuit breaker and connected through connection means such as an input/output port, and the communication unit installed on the leakage circuit breaker to input setting data received through an external wired or wireless communication network.

The setting unit 261 may input and store a set value of at least one comparison parameter. Here, the comparison parameter may include reference values (a first reference current value and a second reference current value to be described later) to determine whether the magnitude of the leakage current of the fundamental wave component is normal, a threshold component ratio as a reference ratio to determine whether the ratio of the third harmonic component is normal, a reference ratio of pole peaks as a reference ratio to determine whether the ratio of the positive pole peak current value to the negative pole peak current value is normal, and a number of threshold generations to determine whether the trip control signal is generated by comparing the number of threshold generations with accumulated count values of number of generations of abnormal state.

Here, the reference value of the leakage current magnitude of the fundamental wave component may include a first reference current value set according to a sensitivity to the leakage current, and a second reference current value set to distinguish an abnormal current and exceeding the first reference current value.

In other words, the first reference current value refers to a reference value that distinguishes a determination sensitivity determining whether or not leakage current is generated according to the magnitude of the leakage current in the earth leakage circuit breaker, and may be set to any one of 0 to 10 amperes (A). For example, when the earth leakage circuit breaker has high sensitivity, the first reference current value is set to any one of 0 to 100 milliampere (mA), and when the earth leakage circuit breaker has medium sensitivity, the first reference current value is set to any one value of 100 milliampere (mA) to 2 amperes (A), and when the earth leakage circuit breaker has low sensitivity, the first reference current value may be set to any one of 2 amperes (A) to 10 amperes (A).

Here, the second reference current value may refer to a reference value to distinguish between a leakage current generation state on a circuit and a balanced current state (or a normal state) on a circuit with respect to the leakage current detection signal. For example, the second reference current value may be set to 2.5 amperes (A).

Next, in order to distinguish between the balanced current state and the leakage current generation state on the circuit, the threshold component ratio of the third harmonic component may be set to 50 percent (%) according to a preferred embodiment. Here, the component ratio of the third harmonic component may refer to a ratio (%) of the magnitude of the third harmonic component to a magnitude (or amplitude (Volt)) of the fundamental wave component in the frequency domain. Accordingly, when the ratio of the third harmonic component calculated based on a digital conversion of the leakage current detection signal and the discrete Fourier transform data provided by the conversion unit 263 is less than 50%, the control unit 160 may determine that a leakage current has been generated on the circuit.

Meanwhile, the reference ratio of pole peaks of the positive pole peak current value to the negative pole peak current value may be set to 150% according to a preferred embodiment. Here, the ratio of pole peaks is the ratio (%) of the positive pole peak current value to the negative pole peak current value. In a state of a balanced current, the ratio of the positive pole peak current value to the negative pole peak current value is almost 100%.

Therefore, when the ratio of the third harmonic component calculated based on a digital conversion of the leakage current detection signal and the discrete Fourier transform data provided by the conversion unit 263 is not less than 150%, the control unit 160 may determine that a leakage current has been generated on the circuit.

The conversion unit 263 may include an analog to digital converter (ADC) 263a, a discrete Fourier transformer (DFT) 263b, an alternating current component converter 263c, and a direct current component converter 263d.

The analog to digital converter 263a may convert the leakage current detection signal that is detected by the leakage current detection unit 140, converted into an analog voltage signal through the current processing unit 150, and high frequency noise is removed therefrom.

The discrete Fourier transformer 263b converts the digital signal in the time domain converted by the analog to digital converter 263a into a digital signal in the frequency domain through Fourier transform.

The alternating current component converter 263c may determine the magnitude of the leakage current of the fundamental wave component (the magnitude of the fundamental wave component) and the magnitude of the third harmonic component, based on the discrete Fourier transformed digital signal (digital data), and calculate the ratio of the third harmonic component, which is the ratio of the magnitude of the third harmonic component to the leakage current magnitude of the fundamental wave component (the magnitude of the fundamental wave component).

The direct current component converter 263d may calculate the ratio of the positive pole peak current value to the negative pole peak current value based on the discrete Fourier transformed digital signal.

Therefore, the conversion unit 263 may calculate the magnitude of the fundamental wave component, the ratio of the third harmonic component, and the ratio of the positive pole peak current value to the negative pole peak current value based on the digital signal in the frequency domain converted by the discrete Fourier transformer.

The determination unit 265 may determine whether or not a leakage current (or ground fault current) is generated in the circuit, based on the magnitude of the fundamental wave component, the ratio of the third harmonic component, and the ratio of the positive pole peak current value to the negative pole peak current value. To this end, the determination unit 265 may compare the magnitude of the fundamental wave component, the ratio of the third harmonic component, and the ratio of the positive pole peak current value to the negative pole peak current value with corresponding reference parameters. Here, the reference parameters are the first reference current value, the second reference current value, the threshold component ratio of the third harmonic component, and the reference ratio of pole peaks of the positive pole peak current value to the negative pole peak current value.

When it is determined to be abnormal based on a result of the comparison, the determination unit 265 may increase the count value of the number of generations. For example, the determination unit 265 may increase the number of generations from 0 to 1 when the leakage current is generated for the first time, or from 3 to 4 when the leakage current has been generated 3 times already.

On the other hand, when it is determined to be normal as a result of the comparison (when the three-phase current of the circuit is determined to be in a balanced state), the determination unit 265 may initialize the count value of the number of generations to zero.

The command unit 267 may output the trip control signal to the trip coil unit 130 based on the determination result of the determination unit 265. That is, when the determination unit 265 determines that the count value of the number of generations is not less than a predetermined threshold value, the command unit 267 may output the trip control signal to the trip coil unit 130.

Figure 2:
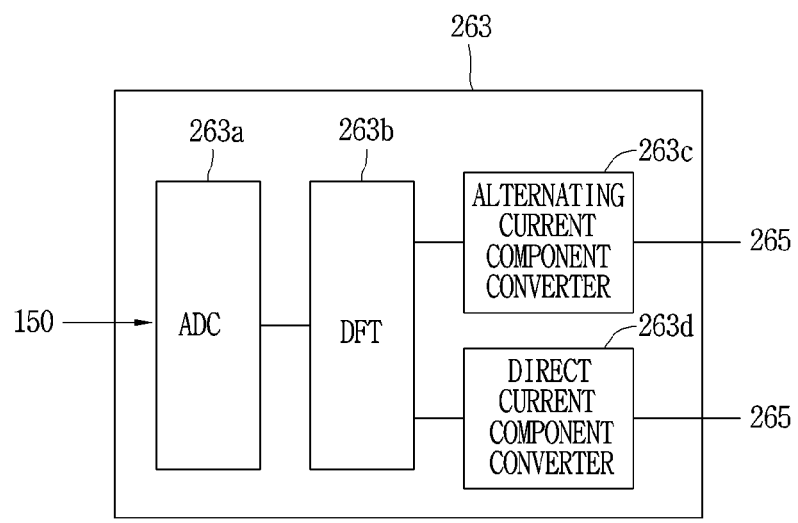
FIG. 2 is a block diagram illustrating a detailed configuration of a conversion unit in the earth leakage circuit breaker according to a preferred embodiment of the present disclosure.

Meanwhile, referring to FIG. 2 and referring to FIG. 1 as an auxiliary, operations of the earth leakage circuit breaker according to a preferred embodiment of the present disclosure will be described.

FIG. 3 is a flowchart illustrating an operation method of the earth leakage circuit breaker according to an embodiment of the present disclosure.

When a leakage current is generated on a circuit, accordingly an unbalanced state current is generated without achieving 3-phase equilibrium in the leakage circuit breaker of the present disclosure. Therefore, firstly, in step S1, the leakage current detection unit 140 induces the leakage current through the secondary winding of the zero current transformer to output it as the leakage current detection signal.

In addition, in step S1, the current processing unit 150 in the leakage circuit breaker of the present disclosure converts the leakage current detection signal detected by the leakage current detection unit 140 into an analog voltage signal by the shunt resistor 251, removes high frequency noise that might be mixed with the leakage current detection signal through the low pass filter unit 253, then supplies it to the control unit 160.

Thereafter, in step S2, the conversion unit 263 of the control unit 160 converts the leakage current detection signal provided by the current processing unit 150 as an analog voltage signal into a digital signal through the analog to digital converter, and converts the converted digital signal in the time domain into a digital signal in the frequency domain through the discrete Fourier transformer.

Subsequently, in step S3, the conversion unit 263 of the control unit 160 calculates the magnitude (or amplitude (Volt)) of the fundamental wave component, the ratio of the third harmonic component, and the ratio of the positive pole peak current value to the negative pole peak current value, based on the digital signal converted into the frequency domain.

Thereafter, in step S4, the determination unit 265 of the control unit 160 compares the magnitude of the fundamental wave component provided by the conversion unit 263 with the first reference current value read from the setting unit 261.

In step S4, the determination unit 265 of the control unit 160 proceeds to step S5 when the magnitude of the fundamental wave component provided by the conversion unit 263 is not less than the first reference current value read from the setting unit 261. When the magnitude of the fundamental wave component is less than the first reference current value in step S4, the determination unit 265 of the control unit 160 returns the control operation to step S3.

In step S5, the determination unit 265 of the control unit 160 compares the magnitude of the fundamental wave component provided by the conversion unit 263 with the second reference current value read from the setting unit 261.

In step S5, the determination unit 265 of the control unit 160 proceeds to step S8 when the magnitude of the fundamental wave component provided by the conversion unit 263 is not less than the second reference current value read from the setting unit 261. When the magnitude of the fundamental wave component in step S5 is less than the second reference current value, the determination unit 265 of the control unit 160 proceeds to step S6.

When proceeded to step S6, the determination unit 265 of the control unit 160 compares the ratio of the third harmonic component, which is the ratio of the magnitude of the third harmonic component to the leakage current magnitude of the fundamental wave component (the magnitude of the fundamental wave component) supplied by the conversion unit 263, with the threshold component ratio of the third harmonic component read from the setting unit 261 (expected implementation 50%).

In step S6, the determination unit 265 of the control unit 160 proceeds to step S8 when the ratio of the third harmonic component supplied by the conversion unit 263 is less than the threshold component ratio (expected implementation 50%) of the third harmonic component read from the setting unit 261. And, when the ratio of the third harmonic component is not less than the threshold component ratio (expected implementation 50%) of the third harmonic component, the determination unit 265 of the control unit 160 proceeds to step S7.

When proceeded to step S7, the determination unit 265 of the control unit 160 compares the ratio of the positive pole peak current value to the negative pole peak current value provided by the conversion unit 263 with the reference ratio of pole peaks read from the setting unit 261.

Step S7 may be performed with being divided into detailed operation steps S7-1 and S7-2.

In step S7-1, the determination unit 265 of the control unit 160 compares the ratio of the positive pole peak current value to the negative pole peak current value provided by the direct current component converter 263d in the conversion unit 263 with the reference ratio of pole peaks read from the setting unit 261.

When the ratio of the positive pole peak current value to the negative pole peak current value is less than the reference ratio of pole peaks in step S7-1, the determination unit 265 of the control unit 160 proceeds the control operation step to step S8-1. And, the ratio of the positive pole peak current value to the negative pole peak current value is not less than the reference ratio of pole peaks in step S7-1, the determination unit 265 of the control unit 160 proceeds the control operation step to S7-2 to determine that a leakage current of the direct current component is generated.

When the magnitude of the fundamental wave component provided by the conversion unit 263 is not less than the second reference current value read from the setting unit 261 in step S5, or the third harmonic component ratio provided by the conversion unit 263 is less than the threshold component ratio of the third harmonic component read from the setting unit 261 (expected implementation 50%) in step S6, the determination unit 265 of the control unit 160 proceeds to step S8 to determine that a leakage current of the alternating current component is generated, and then proceeds to step S9.

In step S9, the determination unit 265 of the control unit 160 increases the count value of the number of generations by "1".

When the ratio of the positive pole peak current value to the negative pole peak current value is less than the reference ratio of pole peaks in step S7-1, this state is not determined such that the magnitude of the fundamental wave component has reached a level that the circuit should be cut off, or a leakage current or ground fault current is generated on a circuit, or a leakage current of the direct current component is generated. Therefore, the determination unit 265 of the control unit 160 determines that the three-phase current on the circuit is in a normal state (three-phase equilibrium) in step S8-1, and then initialize the count value of the number of generations to zero.

Subsequently, in step S10, the determination unit 265 of the control unit 160 determines whether the count value of the number of generations has reached a predetermined reference number of times in which cutoffs (trips) are needed.

Here, the number of generations 1 indicates that the leakage current or ground fault current is generated in the circuit for 10 milliseconds (ms), and the number of generations 2 indicates that the leakage current or ground fault current is generated for 20 milliseconds (ms). The number of generations 10 may indicate that the leakage current or ground fault current is generated for 100 milliseconds (ms).

For example, a reference number of times in which cutoffs are needed may be set to 10.

In addition, in step S10, when the count value of the number of generations has reached the predetermined reference number of times in which cutoffs (trips) are needed, that is, when the two values are the same, the determination unit 265 of the control unit 160 notify the command unit 267 that the count value of the number of generations has reached the predetermined reference number of times.

In response to this, the command unit 267 of the control unit 160 finally outputs the trip control signal in step S11.

The trip control signal allows the direct current power to be supplied to the trip coil 233 from the power supply unit 120 by turning on the semiconductor switch 231 so that trip coil 233 is magnetized. As the armature (not illustrated) triggers the switching mechanism to be tripped while the armature is moved by the magnetization of the trip coil 233, the earth leakage circuit breaker trips (automatically cuts off the circuit), and accordingly the circuit in which the leakage current or ground fault current is generated is cut off.

As described above, since the earth leakage circuit breaker according to the present disclosure includes: a leakage current detection unit for outputting a leakage current detection signal according to the leakage current from a circuit; a conversion unit for outputting the leakage current magnitude of a fundamental wave component, a ratio of a third harmonic component, and a ratio of a positive pole peak current value to a negative pole peak current value, on the basis of the leakage current detection signal outputted from the current detection unit; and a control unit for comparing the leakage current magnitude of a fundamental wave component, the ratio of a third harmonic component, and the ratio of a positive pole peak current value to a negative pole peak current value, outputted by the conversion unit, with predetermined reference values to determine whether or not a leakage current of the alternating current component is generated or a leakage current of the direct current component is generated and to thereby output a trip control signal when it is determined that the leakage current of the direct current or alternating current component is generated, the earth leakage circuit breaker may reliably detect a generation of a leakage current of the alternating current component on a circuit separately from a balanced current (3-phase balanced current or normal current), and also reliably detect a generation of a leakage current of the direct current component on a circuit separately from a balanced current to cut off the circuit.

The invention claimed is:

1. An earth leakage circuit breaker comprising:
   a leakage current detection unit for outputting a leakage current detection signal according to a leakage current from a circuit;
   a conversion unit for outputting a leakage current magnitude of a fundamental wave component, a ratio of a third harmonic component, and a ratio of a positive pole peak current value to a negative pole peak current value, on a basis of the leakage current detection signal outputted from the leakage current detection unit; and
   a control unit for comparing the leakage current magnitude of a fundamental wave component, the ratio of a third harmonic component, and the ratio of a positive pole peak current value to a negative pole peak current value, outputted by the conversion unit, with predetermined reference values to determine whether or not a leakage current of an alternating current (AC) component is generated or a leakage current of a direct current (DC) component is generated and to thereby output a trip control signal when it is determined that the leakage current of the DC component or the AC component is generated,
   wherein the control unit is further configured to:
      when the leakage current is detected, detect whether a current of the circuit is in a balanced current state that is distinguished from the leakage current of the AC component and the leakage current of the DC component, based on the leakage current magnitude of the fundamental wave component, the ratio of the third harmonic component, and the ratio of the positive pole peak current value to the negative pole peak current value, and
      restrict output of the trip control signal when the current of the circuit is in the balanced current state.

2. The earth leakage circuit breaker of claim 1, wherein the conversion unit comprises:
   an analog to digital converter configured to convert the leakage current detection signal, which is an analog signal, into a digital signal in a time domain by sampling the leakage current detection signal;
   a discrete Fourier transformer configured to output the converted digital signal as a digital signal in a frequency domain by discrete Fourier transform;
   an alternating current component converter configured to determine the leakage current magnitude of the fundamental wave component and a magnitude of the third harmonic component based on the discrete Fourier transformed digital signal, and to calculate a ratio of the third harmonic component that is a ratio of the magnitude of the third harmonic component to the leakage current magnitude of the fundamental wave component; and
   a direct current component converter configured to calculate a ratio of the positive pole peak current value to the negative pole peak current value based on the discrete Fourier transformed digital signal.

3. The earth leakage circuit breaker of claim 1,
   wherein the leakage current detection unit detects that the leakage current is detected and outputs the leakage current detection signal when the current of the circuit is greater than a first reference current value set according to a sensitivity to the leakage current
   wherein the control unit determines that the leakage current of the AC component has occurred when the leakage current magnitude of the fundamental wave component is equal to or greater than a second reference current value; and
   wherein the second reference current value is greater than the first reference current value.

4. The earth leakage circuit breaker of claim 3, wherein the control unit is configured to:
   increase a number of occurrences of abnormal current when the leakage current magnitude of the fundamental wave component is not less than the second reference current value, and when the increased number of abnormal current occurrences reaches a predetermined threshold value, output the trip control signal by determining that a leakage current of an alternating current component is generated.

5. The earth leakage circuit breaker of claim 4, wherein the control unit is configured to:
increase the number of occurrences of the abnormal current when the third harmonic component ratio is less than a reference third harmonic component ratio and the leakage current magnitude of the fundamental wave component is less than the second reference current value, and
when the increased number of abnormal current occurrences reaches a predetermined threshold value, output the trip control signal.

6. The earth leakage circuit breaker of claim 5, wherein the control unit is configured to:
increase the number of occurrences of the abnormal current when the ratio of the positive pole peak current value to the negative pole peak current value is not less than a predetermined reference ratio and the third harmonic component ratio is not less than the reference third harmonic component ratio, and
when the increased number of abnormal current occurrences reaches a predetermined threshold value, output the trip control signal.

7. The earth leakage circuit breaker of claim 6, wherein the control unit is further configured to:
determine that the current of the circuit is in a balanced current state, when the leakage current magnitude of the fundamental wave component is less than the second reference current value, and the ratio of the third harmonic component is not less than the reference third harmonic component ratio, and the ratio of the positive pole peak current value to the negative pole peak current value is less than a predetermined reference ratio, and
initialize the number of abnormal current occurrences counted when the current of the circuit is in the balanced current state.

* * * * *